(12) United States Patent
Yasuhara

(10) Patent No.: US 10,340,790 B1
(45) Date of Patent: Jul. 2, 2019

(54) INTEGRATED VOLTAGE CORRECTION USING ACTIVE BANDPASS CLAMP

(71) Applicant: Coolstar Technology, Inc., Santa Clara, CA (US)

(72) Inventor: James Andrew Akio Yasuhara, San Francisco, CA (US)

(73) Assignee: COOLSTAR TECHNOLOGY, INC., Santa Clara, CA (US)

( * ) Notice: Subject to any disclaimer, the term of this patent is extended or adjusted under 35 U.S.C. 154(b) by 0 days.

(21) Appl. No.: 16/134,171

(22) Filed: Sep. 18, 2018

(51) Int. Cl.
  *H02M 3/04* (2006.01)
  *H03H 7/01* (2006.01)
  *H03F 3/20* (2006.01)

(52) U.S. Cl.
  CPC ............ *H02M 3/04* (2013.01); *H03H 7/0161* (2013.01); *H03F 3/20* (2013.01)

(58) Field of Classification Search
  CPC ......... H02M 3/04; H02M 3/06; H03H 7/0161
  USPC ....................................................... 327/540
  See application file for complete search history.

(56) References Cited

U.S. PATENT DOCUMENTS

| | | | |
|---|---|---|---|
| 9,397,567 B2 | 7/2016 | Searles et al. | |
| 2014/0266119 A1* | 9/2014 | Burton | H02M 3/157 323/283 |
| 2015/0168971 A1* | 6/2015 | Tomioka | G05F 1/562 323/275 |
| 2017/0083070 A1 | 3/2017 | Drogi et al. | |

* cited by examiner

*Primary Examiner* — William Hernandez
(74) *Attorney, Agent, or Firm* — Hoffman & Baron, LLP

(57) ABSTRACT

An exemplary voltage correction circuit includes a high-pass filter coupled with an integrated load, and an active clamp coupled with the high-pass filter in a closed-loop feedback arrangement. The high-pass filter includes an impedance network having a frequency response defining a lower frequency boundary of a passband of the voltage correction circuit, and the active clamp has a frequency response defining an upper frequency boundary of the passband of the voltage correction circuit. The active clamp is adapted to receive an input voltage proportional to a load transient within the passband and to generate an output current of the voltage correction circuit that cancels the effects of the load transient. A loop gain of the voltage correction circuit is greater than or equal to one within the passband and is less than one for frequencies lower than the lower frequency boundary and higher than the upper frequency boundary.

19 Claims, 6 Drawing Sheets

INTEGRATED VOLTAGE CORRECTION USING ACTIVE BANDPASS CLAMP

FIELD

The present invention relates generally to the electrical, electronic and computer arts, and, more particularly, to integrated voltage regulation.

BACKGROUND

Voltage regulators are ubiquitously used in electronic circuitry and electronic systems and are critical in maintaining the voltage of a power source within acceptable limits; that is, a voltage regulator is necessary to keep voltages within a prescribed range that can be tolerated by the electronic circuitry or system using that voltage. Voltage regulators are used in electronic equipment in which excessive variations in voltage would be detrimental. For example, electronic voltage regulators are found in devices such as computer power supplies where they stabilize the direct current (DC) voltages used by the processor and other circuit components.

There are various categories of voltage regulators, each class having a characteristic circuit architecture and application. Active regulators represent one category of voltage regulators that employ at least one active component, such as a transistor or operational amplifier, and include linear regulators, switching regulators and silicon controlled rectifier (SCR) regulators. Moreover, within these categories, there are often sub-categories of voltage regulator topologies. For example, linear regulators are often classified into series regulators and shunt regulators.

Switching regulators are one common type of voltage regulator. In simple terms, switching regulators rapidly switch a series element on and off, with a duty cycle of the switch controlling how much charge is transferred to a load connected to the regulator. This duty cycle is controlled by a feedback mechanism similar to the feedback scheme used in a linear regulator. Because the series element is either fully conducting or switched off, it dissipates almost no power, thus giving the switching regulator its characteristic high efficiency compared to, for example, linear regulators. One disadvantage of switching regulators, however, is that they require an inductor that acts as an energy storage element, which when integrated on a die, consumes substantial area and requires additional semiconductor process layers.

SUMMARY

One or more embodiments of the present invention provide techniques for highly efficient, high-speed voltage correction without the need for an on-chip regulator. Aspects of the invention provide a switching voltage regulator which utilizes an active bandpass clamp. The active bandpass clamp, in one or more embodiments, is a high-speed amplifier adapted to suppress load-step noise within a specific frequency range. This active bandpass clamp circuit architecture offers several advantages over conventional approaches to suppressing load-step noise. For instance, the switching voltage regulator utilizing an active bandpass clamp according to one or more embodiments of the invention is frequency triggered, and thus the clamping action is initiated as soon as the load-step is detected. By contrast, threshold triggered voltage regulators must allow a minimum amount of droop to occur before being activated and therefore have an inherent latency and increased output voltage variation associated therewith. Furthermore, compared to high-speed series approaches, the voltage regulator with active bandpass clamp, in one or more embodiments, utilizes a parallel (i.e., shunt) design approach which has far less DC impact on efficiency. The active bandpass clamp architecture may be designed with or without an inductor, making it much more easily integrated than either a conventional series or shunt switching regulator architecture.

An exemplary voltage correction circuit includes a high-pass filter coupled with an integrated load at a first node, and an active clamp coupled with the high-pass filter in a closed-loop feedback arrangement. The high-pass filter includes an impedance network having a frequency response defining a lower frequency boundary of a passband of the voltage correction circuit, and the active clamp has a frequency response defining an upper frequency boundary of the passband of the voltage correction circuit. The active clamp is adapted to receive an input voltage to be regulated and to generate a regulated output voltage of the voltage correction circuit. A loop gain of the voltage correction circuit is greater than or equal to one within the passband and is less than one for frequencies lower than the lower frequency boundary and higher than the upper frequency boundary.

As may be used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Various units, circuits, modules, or other components may be described herein as being "configured to" perform a particular task or tasks. In such contexts, the term "configured to" is intended to be construed broadly as a recitation of structure generally meaning "having circuitry that" performs the task or tasks during operation. As such, the unit/circuit/module/component can be configured to perform the subject task or tasks even when the unit/circuit/module/component/ is not currently powered on. In general, circuitry that forms the structure corresponding to "configured to" may include hardware circuits and/or memory storing program instructions executable to implement the operation. Similarly, various units/circuits/modules/components may be described as performing a task or tasks, for convenience in the description. Such descriptions should be interpreted as including the phrase "configured to." Reciting a unit/circuit/module/component that is configured to perform one or more tasks is expressly intended not to invoke a 35 U.S.C. § 112, paragraph (f) interpretation for that unit/circuit/module/component.

Techniques according to embodiments of the present invention provide substantial beneficial technical effects. By way of example only and without limitation, one or more embodiments of the invention achieve one or more of the following, among other benefits:

Reduces latency, since frequency-triggered clamps according to embodiments of the invention, as opposed to conventional threshold-triggered clamps, enable the clamping action to be initiated as soon as a load-step is detected;

Because the clamp according to embodiments of the invention is frequency controlled, no external control or reference voltage is required;

Utilizes a parallel architecture which, compared to high-speed series approaches, has far less DC impact on efficiency;

Eliminates the necessity of an internal inductor; that is, an integrated voltage regulator according to embodiments of the invention can be implemented using a class AB amplifier with no inductor, and if an inductor can be tolerated, a more efficient class D amplifier can be used;

Provides the ability to split the clamping circuit into pull-up or pull-down only components, thereby adding more flexibility to reduce area and power consumption and to more easily adapt the circuit to various applications.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Principles of the present invention will be described herein in the context of illustrative integrated voltage correction circuitry including an active bandpass clamp. It is to be appreciated, however, that the invention is not limited to the specific devices, circuits, systems and/or methods illustratively shown and described herein. Rather, aspects of the present disclosure relate more broadly to techniques for highly efficient, high-speed voltage correction (e.g., voltage regulation) without the need for an on-chip inductor, thereby providing an easily integrated voltage regulation solution. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

As previously stated, switching regulators are one type of active voltage regulator that can achieve high efficiency, and are therefore commonly utilized in applications where low power dissipation is desired. However, conventional switching regulators, both series and shunt, have several disadvantages.

Figure 1:
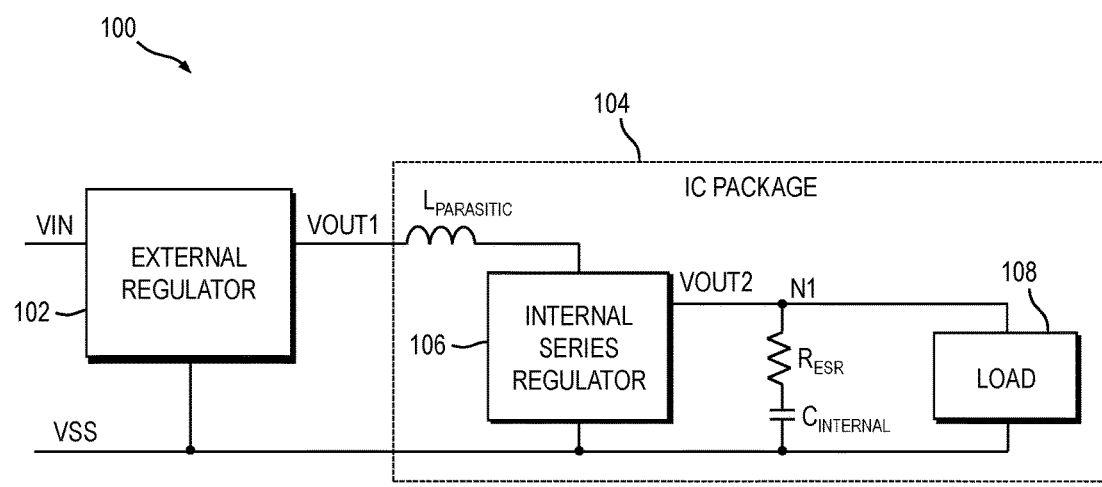
FIG. 1 is an electrical schematic diagram depicting at least a portion of an illustrative fully integrated voltage regulator (FIVR) circuit.

FIG. 1 is an electrical schematic diagram depicting at least a portion of an illustrative fully integrated voltage regulator (FIVR) circuit 100. The voltage regulator circuit 100 includes an external voltage regulator 102 connected to an integrated circuit (IC) package 104. The external voltage regulator 102 is a three-terminal device having an input configured to receive an unregulated input voltage, VIN, supplied to the external voltage regulator, a ground terminal which is connected to VSS or ground, and an output terminal configured to generate a first regulated output voltage, VOUT1, which is supplied to the IC 104 and is used as a supply voltage for the IC.

The IC 104 includes circuitry adapted to utilize the first regulated output voltage VOUT1, but which requires either a different voltage level or a tighter tolerance regarding variation of its supply voltage. In order to provide an enhanced level of voltage regulation, thereby easing the burden on the external voltage regulator 102, the IC 104 includes an internal series voltage regulator 106 that is connected to the output terminal of the external voltage regulator 102, this connection having a parasitic series inductance, $L_{PARASITIC}$, associated therewith. The internal series voltage regulator 106, which, like the external voltage regulator 102, is also connected to VSS or ground, is configured to generate a second regulated output voltage, VOUT2, at an output terminal of the internal series voltage regulator.

Circuitry internal to the IC 104, such as a processor, is connected to the internal series voltage regulator 106 at a node, N1, and is represented generally as a load 108 of the IC. The load 108 is also connected to VSS, as shown. The internal series voltage regulator 106 uses the processor/load 108 as a controller for the FIVR circuit 100. An equivalent series resistance, $R_{ESR}$, and internal capacitance, $C_{INTERNAL}$, of the IC 104 are shown connected together in series between node N1 and VSS. The internal series voltage regulator 106 in this architecture is preferably a high-speed switching regulator. The internal regulator 106 may use the processor (load 108) as a controller to control a duty cycle of the voltage at node N1, and thereby control the output voltage VOUT2.

The FIVR circuit 100 has several disadvantages, including, but not limited to, the necessity for internal inductors functioning as an energy storage element. These internal inductors, aside from consuming substantial on-chip area, require additional IC process layers, thereby adding significant cost and complexity to the fabrication of the IC 104.

Additionally, there is a significant loss in efficiency when going through the FIVR circuit 100, which is due to multiple factors. The speed of a series regulator is determined by how quickly it can switch. The higher the frequency of the series regulator, the lower the required inductance. The lower the inductance, the faster the current (I) can change with time (dI/dt), which is why it is desirable to use a high-frequency series voltage regulator. Furthermore, it is difficult to make large integrated inductances, so the switching frequency is limited to being in the very high frequency (VHF) range, which may or may not be desirable.

While higher frequencies are beneficial from a transient perspective, there is a significant tradeoff in efficiency. Higher frequency means that one or more switches in the series regulator must turn on and off faster, which increases gate charge loss because each switch has some parasitic capacitance associated with it that must be charged and discharged. In addition, each time a switch is turned on and off there is transition loss, where the switch node is transitioning from ground (VSS) to supply voltage level, and vice versa. In that time, until the voltage reaches its desired level, there is some large amount of current flow, and since power is equal to current multiplied by voltage, there is a corresponding large power loss.

Both gate charge loss and transition loss increase with higher switching frequency, which leads to a drop in efficiency. For example, the efficiency at the output (VOUT1) of the external voltage regulator 102 running at a frequency of about 600 kilohertz (KHz) may be as high as about 95 percent, while the efficiency at the output (VOUT2) of the internal series voltage regulator 106 running at about 100 megahertz (MHz) may only be about 80 percent. Furthermore, because the FIVR circuit 100 utilizes an internal series voltage regulator 106, it is running continuously, and all of the power must pass through the series regulator. The decrease in efficiency is generally manifested, to a large extent, as increased on-chip heat dissipation, which must then be removed from the IC package in some manner (e.g., external heatsink, careful thermal design of the IC package, etc.).

Figure 2:
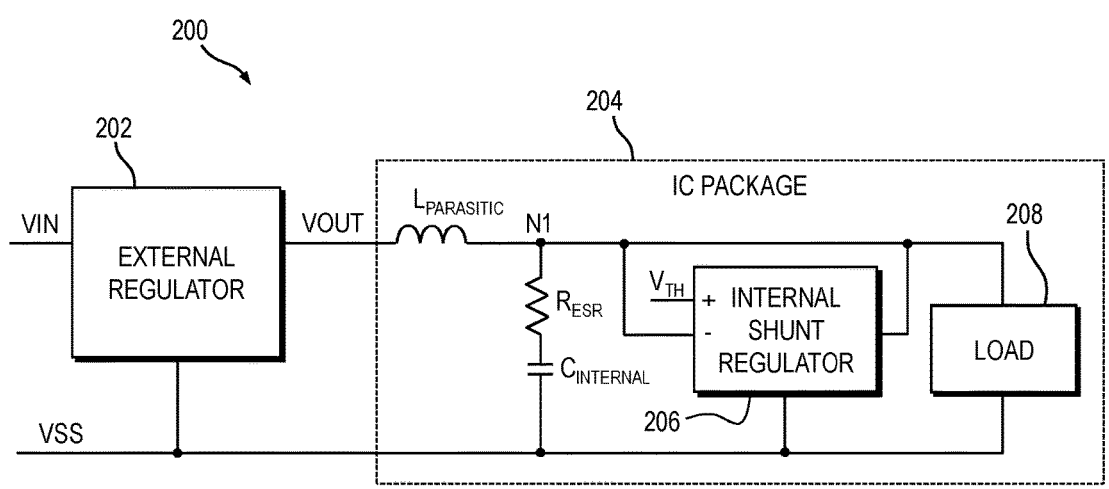
FIG. 2 is an electrical schematic diagram depicting at least a portion of an illustrative shunt internal voltage regulator (SIVR) circuit.

FIG. 2 is an electrical schematic diagram depicting at least a portion of an illustrative shunt internal voltage regulator (SIVR) circuit 200. The SIVR circuit 200 includes an external voltage regulator 202 connected to an IC package 204. Similar to the FIVR circuit 100 shown in FIG. 1, the external voltage regulator 202 is a three-terminal device having an input configured to receive an unregulated input voltage, VIN, supplied to the external voltage regulator, a voltage return terminal which is connected to VSS or ground in this example, and an output terminal configured to generate a regulated output voltage, VOUT, which is supplied to the IC 204 and is used as a supply voltage for the IC.

The IC 204 includes circuitry adapted to utilize the regulated output voltage VOUT, but which requires a tighter tolerance regarding variation of its supply voltage. In order to provide an enhanced level of voltage regulation, thereby easing the burden on the external voltage regulator 202, the IC 204 includes an internal shunt voltage regulator 206 which has a first input, which is an inverting (−) input, connected to the output terminal of the external voltage regulator 202, this connection having a series inductance, $L_{PARASITIC}$, associated therewith, at a node, N1, and has an output connected to node N1 in a negative feedback configuration; node N1 functions as a switch node in this example. A voltage return of the internal shunt voltage regulator 206 is connected to VSS.

The internal shunt voltage regulator 206 further includes a second input, which is a non-inverting (+) input, adapted to receive a prescribed threshold voltage, $V_{TH}$. Circuitry internal to the IC 204, such as a processor, is connected to the internal shunt voltage regulator 206 at the switch node N1 and is represented generally as a load 208 of the IC. The SIVR circuit 200 may require the processor/load 208 to act as a controller. An equivalent series resistance, $R_{ESR}$, and internal capacitance, $C_{INTERNAL}$, of the IC 204 are shown connected together in series between node N1 and VSS.

The internal shunt voltage regulator 206 in this architecture is preferably a high-speed switching regulator. The shunt voltage regulator 206 only turns on when the level of the output voltage VOUT from the external voltage regulator 202 drops below the prescribed reference threshold voltage $V_{TH}$. This enables the SIVR circuit 200 to achieve higher efficiency compared to the FIVR circuit 100 shown in FIG. 1, at least in part because the SIVR circuit is only turned on when needed, unlike the FIVR circuit 100 which is turned on continuously. However, the SIVR circuit 200 has an inherent latency resulting from a threshold voltage detection requirement, and therefore suffers from a slower response time in comparison to the FIVR circuit architecture shown in FIG. 1. Furthermore, the SIVR circuit 200, like the FIVR circuit 100, requires an internal inductor functioning as the energy storage element, and therefore both circuit topologies (FIVR and SIVR) share similar IC space consumption and process complexity disadvantages.

In accordance with one or more aspects of embodiments of the present invention, a switching voltage regulator is provided which utilizes an active bandpass clamp circuit. The active bandpass clamp circuit, in one or more embodiments, is a high-speed amplifier adapted to suppress load-step noise within a specific frequency range. This active bandpass clamp circuit architecture has several advantages over conventional approaches to suppressing load-step noise. For instance, the switching voltage regulator utilizing an active bandpass clamp circuit according to one or more embodiments of the invention is frequency-triggered, and thus the clamping action can be initiated as soon as the load-step is detected, thereby essentially eliminating the inherent latency associated with threshold-triggered voltage regulator topologies, like the SIVR circuit 200 shown in FIG. 2. Furthermore, by being frequency-triggered, no additional reference threshold voltage or other external control signal is needed, as the clamp does not require, as a control input, a reference signal indicative of the target voltage; that is, the clamp does not need to be informed what the target voltage is.

By contrast, threshold-triggered clamps, such as the illustrative voltage regulator circuit 200 shown in FIG. 2, require an external reference or control signal, and must allow a minimum amount of droop to occur before being activated. Consequently, threshold-triggered clamps have an inherent latency associated therewith. Furthermore, compared to high-speed series approaches, the voltage regulator with active bandpass clamp, in one or more embodiments, utilizes a parallel (i.e., shunt) design approach which has far less DC impact on efficiency.

As previously stated, one disadvantage of either a conventional parallel (SIVR) or series (FIVR) switching voltage regulator is the need for an internal inductor which acts as the energy storage element. This internal inductor consumes substantial chip area and increases the complexity and cost of the IC fabrication process. A switching voltage regulator utilizing an active bandpass clamp, according to one or more embodiments of the invention, can be implemented using a class AB amplifier without an inductor. Furthermore, if having an internal inductor is tolerable (e.g., connected between the active clamp and the regulated load voltage), a more efficient class D amplifier can be employed in the regulator, thereby providing an enhanced degree of flexibility in the circuit design.

Figure 3:
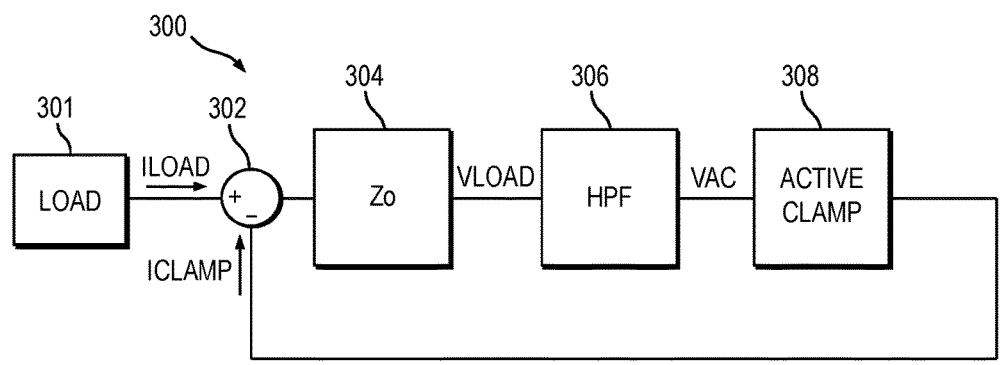
FIG. 3 is a block diagram conceptually depicting at least a portion of an exemplary integrated voltage regulator circuit including an active bandpass clamp, according to an embodiment of the present invention.

FIG. 3 is a block diagram conceptually depicting at least a portion of an exemplary integrated voltage correction circuit 300 including an active bandpass clamp, according to an embodiment of the invention. A primary function of the circuit 300 is to provide voltage correction to overcome the effects of parasitic board and packaging inductances, among other considerations. However, the circuit 300 could also be used to improve transient performance in many applications, for example in applications where it may be desirable to lower the switching speed of the regulator to thereby improve efficiency. Furthermore, while standard voltage regulator circuits generally have a target output voltage requiring an input reference signal, the voltage correction circuit 300, according to one or more embodiments of the invention, does not have an intended output target voltage, and thus does not require such a reference signal.

To illustrate this benefit, by way of an example only, the voltage required by the load may need to be changed during operation in many applications. In the case of the FIVR circuit of FIG. 1, this would mean that a new reference voltage would need to be supplied to the series regulator. Likewise, in the case of the SIVR circuit of FIG. 2, this would mean that both the external regulator and the shunt internal regulator would need to change their target voltages. In contrast, the voltage correction circuit 300 according to one or more embodiments requires no information regarding the target output voltage. Consequently, the term "voltage correction circuit" as may be used throughout the present specification is intended to more appropriately describe the broader functions of the circuit 300, according to aspects of the invention.

The illustrative voltage correction circuit 300 includes a summing element 302, which may be a summing node or junction, adapted to receive, as a first input, which in this embodiment is a non-inverting (+) input, a load current, ILOAD, drawn by a load 301 of the voltage correction circuit. The voltage correction circuit 300 further includes a high-pass filter (HPF) 306 and an active clamp 308 coupled with the summing element 302 through an impedance block (Zo) 304 which represents the impedance as seen by the load 301 and the active clamp 308, including, for example, the external voltage regulator 202 (FIG. 2), any parasitic elements, internal capacitance, and at least a portion of the high pass filter 306. This impedance Zo 304 acts as a bandpass filter for the integrated voltage correction circuit 300, as will be described in further detail below.

With continued reference to FIG. 3, an output signal, VLOAD, of the impedance block 304 is coupled with the high-pass filter 306. The high-pass filter 306 helps to further reject lower frequency signals, thus preventing interaction with the external regulator 202 (FIG. 2). An output signal, VAC, of the high-pass filter 306 is supplied to the active clamp 308. An output signal, ICLAMP, generated by the active clamp 308 is fed to a second input of the summing element 302, which in this embodiment is an inverting (−) input, in a closed-loop feedback configuration. In one or more embodiments, the active clamp 308 comprises a high-transconductance amplifier which effectively functions to push a loop gain of the integrated voltage correction circuit 300 above one (i.e., above unity-gain) within a desired passband (bandwidth) of operation of the voltage correction circuit. The active clamp 308 should have a very high transconductance (Gm) and should be significantly fast. For example, in one or more embodiments, the active clamp 308 is implemented having a transconductance of at least about 100 mhos and a dominant pole at a frequency of about 300 MHz or higher. It is to be appreciated, however, that embodiments of the invention are not limited to any specific transconductance value, frequency bandwidth, or circuit configuration.

In one or more embodiments, the transconductance of the active clamp 308 ideally equals $$\frac{1}{Z_o(fp1)},$$

where Zo(fp1) is the output impedance at the lowest frequency to be clamped, around the dominant pole frequency of the high-pass filter 306. When a loop gain of the integrated voltage correction circuit 300 is much greater than one (i.e., loop gain >>1), ICLAMP will be forced to match ILOAD, through operation of the feedback configuration.

Figure 4:
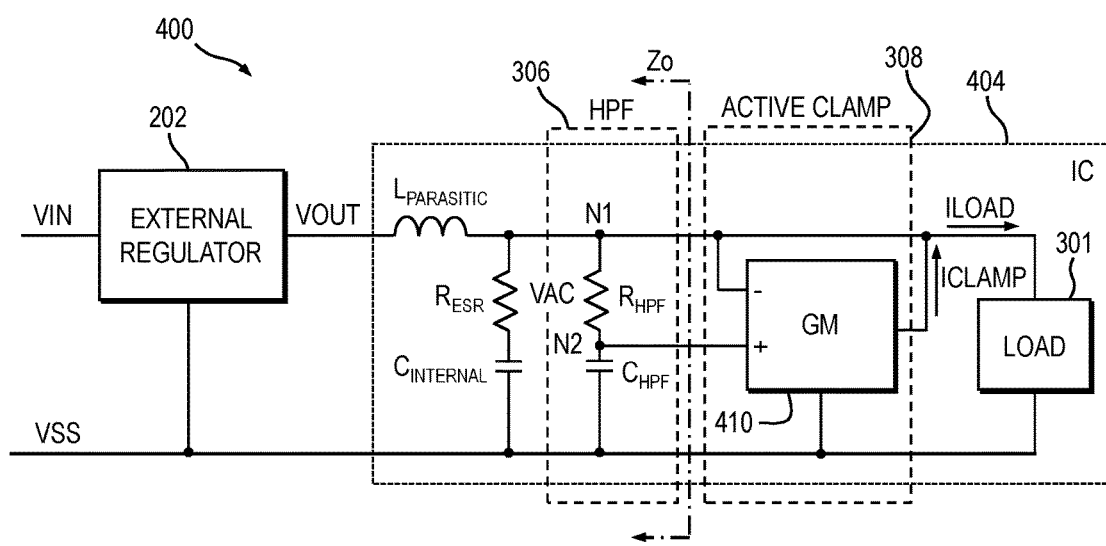
FIG. 4 is an electrical schematic diagram depicting an exemplary circuit implementation of the illustrative regulator circuit shown in FIG. 3, according to an embodiment of the present invention.

FIG. 4 is an electrical schematic diagram depicting an illustrative integrated voltage correction circuit 400 for implementing the exemplary voltage correction circuit 300 shown in FIG. 3, according to an embodiment of the invention. The integrated voltage correction circuit 400 includes an external voltage regulator 202 connected to an IC package 404. Similar to the SIVR circuit 200 shown in FIG. 2, the external voltage regulator 202 is preferably a three-terminal device having an input adapted to receive an unregulated input voltage, VIN, supplied to the external voltage regulator, a voltage return terminal which is connected to VSS or ground (or an alternative voltage source) in this embodiment, and an output terminal configured to generate a regulated output voltage, VOUT, which is supplied to the IC 404 and is used as a supply voltage for the IC. It is to be appreciated that although a separate external voltage regulator 202 is shown in FIG. 4, aspects of the invention merely contemplate that a DC voltage (VOUT), as may be generated by a DC voltage source, will be supplied to the voltage correction circuit 400, without regard for the specific details of the voltage source itself.

The IC 404 includes circuitry adapted to utilize the regulated output voltage VOUT, but which otherwise requires a tighter tolerance regarding variation of its supply voltage. The IC 404, consistent with the block diagram representation shown in FIG. 3, includes a high-pass filter (HPF) circuit 306. In this illustrative embodiment, the high-pass filter circuit 306 comprises a first resistor, $R_{HPF}$, connected in series with a first capacitor, $C_{HPF}$. Specifically, a first terminal of the resistor $R_{HPF}$ is operatively coupled with node N1 as close to the load 301 as possible, so as to act as an output-sensing input. A second terminal of $R_{HPF}$ is connected with a first terminal of the capacitor $C_{HPF}$ at node N2, and a second terminal of $C_{HPF}$ is connected to VSS (voltage return terminal of the external voltage regulator 202). By way of example only and without limitation, suitable values for $R_{HPF}$ is about 1K ohms and $C_{HPF}$ is about 100 picofarad (pF), although embodiments of the invention are not limited to any specific value(s). Other embodiments of the high-pass filter circuit 306, including passive and active arrangements, are similarly contemplated. For example, in one or more alternative embodiments, the capacitor $C_{HPF}$ is connected to node N1 and resistor $R_{HPF}$ is connected to ground, with a voltage across the resistor $R_{HPF}$ being sensed by an active clamp 308 (e.g., transconductance amplifier 410) in the IC 404, as will be explained in further detail below. In an alternative embodiment, an intrinsic gate-to-source capacitance (not explicitly shown, but implied) associated with one or more metal-oxide-semiconductor (MOS) transistor devices in an input stage of the transconductance amplifier provides all, or at least some, of the necessary filtering capacitance, and thus the discrete capacitor $C_{HPF}$ can be eliminated or at least reduced. It is to be appreciated, however, that embodiments of the invention are not limited to MOS transistors; rather, other transistor types may be similarly employed in the active clamp 308, such as, for example, bipolar junction transistors (BJTs), junction field-effect transistors (JFETs), etc., as will become apparent to those skilled in the art.

The IC 404 will have some impedance elements which may be either explicitly added components or inherent parasitic elements. In the illustrative voltage correction circuit 400 of FIG. 4, these impedance elements represent, for example, an inherent parasitic inductance, $L_{PARASITIC}$, of the IC package and printed circuit board (PCB) trace material, in addition to some explicitly added internal capacitance, $C_{INTERNAL}$, which will have some equivalent series resistance, $R_{ESR}$, associated therewith. These impedance elements will contribute to an overall output impedance, Zo, of the circuit 400, as will be described in further detail herein.

As previously stated, the IC 404 further includes an active clamp 308, which in one or more embodiments comprises at least one high-transconductance (Gm) stage 410. More particularly, a first input, which in this embodiment is an inverting (−) input, of the transconductance stage 410 is connected with the high-pass filter 306 at node N1, a second input, which is a non-inverting (+) input of the transconductance stage is connected with a junction of the resistor $R_{HPF}$ and the capacitor $C_{HPF}$ at node N2, and an output of the transconductance stage is connected with the first input at node N1 in a closed-loop negative feedback arrangement. Thus, the transconductance stage 410 preferably includes a differential input and is operative to generate an output signal, ICLAMP, at an output of the transconductance stage that is a function of a differential voltage, VAC, appearing across an output element in the high-pass filter circuit 306, which comprises resistor $R_{HPF}$ in this embodiment. A voltage return of the transconductance stage 410 is connected to VSS in this example. As previously stated, the active clamp 308 is implemented having a high transconductance, such as, for example, at least about 100 mhos. A transconductance stage meeting these parameters may need to be quite large, and may require several milliamperes of current to drive at high speeds, as will become apparent to those skilled in the art.

In another embodiment that uses a plurality of cascaded gain stages to implement the active clamp 308, the transconductance stage 410 is representative of the multiple cascaded gain stages. In still other embodiments, the active clamp 308 may be implemented using other circuit arrangements, such as, but not limited to, a class D amplifier (e.g., employed in a current-mode configuration), which may be beneficial in providing a higher transconductance compared to a transconductance stage. Here, the amount of transconductance may be controlled as a function of duty cycle of the class D amplifier. It will become apparent to those skilled in the art how to implement the active clamp 308 using a class D amplifier. For example, in one or more embodiments, where the circuit design can tolerate an internal inductor, the active clamp 308 comprises a class D amplifier (not explicitly shown, but implied) coupled with an inductor serving as an energy storage element. In this embodiment, the class D amplifier includes a differential input coupled across an output element (e.g., resistor $R_{HPF}$) in the high-pass filter 306, and an output serving as a switching node. The inductor is coupled with the switching node and is configured to supply a current to the load.

Circuitry internal to the IC 404, such as a processor, controller, etc., is connected between node N1 and VSS and is represented as the load 301 of the IC. The impedance Zo seen by the load 301 at node N1 looking back towards the external voltage regulator 202, which includes the impedance of the high-pass filter 306 and any parasitic or internal impedances (e.g., $L_{PARASITIC}$, $R_{ESR}$, $C_{INTERNAL}$), acts as a first order bandpass filter network for the integrated voltage correction circuit 400. The internal capacitance $C_{INTERNAL}$, and its associated equivalent series resistance, $R_{ESR}$, may be adjusted to whatever extent the physical dimensions of the package will allow, but the parasitic inductance $L_{PARASITIC}$ of the IC package 404 is a mostly fixed function of the package design itself. Node N1 also serves as the summing node (e.g., summing element 302 in FIG. 3) for the load current, ILOAD, and the active clamp current, ICLAMP, of the active clamp 308.

As previously stated, where the loop gain of the integrated voltage correction circuit 400 is greater than one, ICLAMP will be forced to match ILOAD. For this illustrative circuit 400, loop gain is determined as the output impedance Zo multiplied by a gain (attenuation) of the high-pass filter 306 multiplied by the transconductance of the active clamp 308 (i.e., Zo*HPF*Gm), all as a function of frequency. This value should be greater than 1 within the bandpass frequency region, but less than 1 both above and below the bandpass upper and lower frequency boundaries, respectively, as determined by the dominant pole of the high-pass filter 306 and the dominant pole of the transconductance stage 410. This requirement that the loop gain be less than one outside of the passband of the voltage correction circuit 400 (i.e., below the lower frequency boundary and above the upper frequency boundary) beneficially reduces the occurrence of ringing in the regulated output voltage.

The frequency response characteristics of the high-pass filter 306 may be controlled as a function of the values used for the resistor $R_{HPF}$ and capacitor $C_{HPF}$, for example, while the frequency response characteristics of the transconductance stage 410 may be controlled as a function of one or more circuit design parameters, including, for example, circuit architecture (e.g., using a cascoded output stage to reduce the amount of Miller capacitance), bias current level (e.g., increased bias current increases the frequency of the dominant pole defining the upper frequency boundary of the voltage correction circuit 400), transistor device sizes (e.g., gate width-to-length ratio, total device area, etc.), gate capacitance of output stage devices, etc. Additionally, in one or more embodiments, by increasing the bypass capacitance $C_{INTERNAL}$, the required high-frequency pole may be reduced, thereby easing the burden placed on the design of the transconductance stage 410.

The active bandpass clamp arrangement of the exemplary integrated regulator circuit 300, 400 shown in FIGS. 3 and 4, respectively, is frequency-triggered, meaning that the clamping action can be initiated as soon as a load-step is detected in the voltage present at node N1 to thereby suppress load-step noise and output voltage variation. This is a superior approach compared to threshold-triggered clamps, which must allow a minimum amount of droop to occur in the input voltage before being activated, thereby resulting in an inherent latency, increased noise and output voltage variation, as previously explained.

The active bandpass clamp arrangement, according to one or more embodiments of the invention, can be separated into distinct pull-up or pull-down circuits and, depending upon the intended design application, used without one or the other (e.g., pull-up only or pull-down only configurations), thus adding more design flexibility to reduce chip area and power consumption in the IC. For instance, consider the circuit 400 used in an application where only overshoot is of concern (because undershoot is handled in a different manner). In this scenario, rather than implementing both pull-up and pull-down functionality, the circuit 400 can be implemented using only the pull-down aspect, assuming stability can still be guaranteed, thereby saving about half the area and current. Using this arrangement may require some modification of the circuit design or the manner in which the circuit is employed to account for stability issues, as will be appreciated by those skilled in the art.

Figure 5:
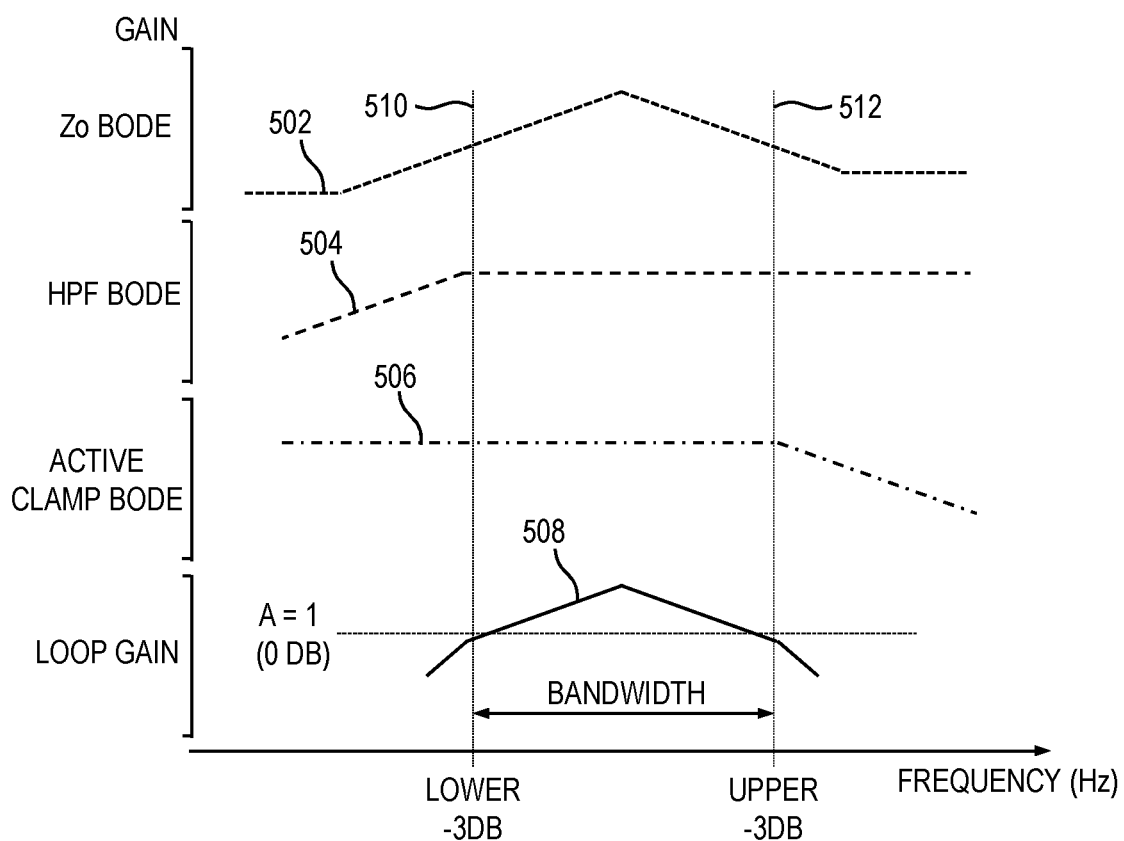
FIG. 5 are graphical bode plots conceptually depicting exemplary frequency response characteristics of the various stages in the illustrative integrated voltage regulator circuit shown in FIGS. 3 and 4, according to an embodiment of the invention.

FIG. 5 are graphical Bode plots conceptually depicting exemplary frequency response characteristics of the various stages in the illustrative integrated voltage correction circuits 300 and 400 shown in FIGS. 3 and 4, respectively, according to an embodiment of the invention. Waveform 502 is a Bode plot for the output impedance network 304. Waveform 504 is a Bode plot for the high-pass filter 306 having a corner frequency that defines a lower −3 dB boundary 510 of the bandpass filter. Waveform 506 is a Bode plot for the active clamp 308 having a corner frequency that defines an upper −3 dB boundary 512 of the bandpass filter. As shown, the frequency transfer characteristic of the active clamp 308 is consistent with a low-pass filter. Waveform 508 depicts loop gain for the integrated voltage correction circuit 400, and is the product of the previous three waveforms 502, 504 and 506. For purposes of stability, in one or more embodiments, the loop gain should only be greater than one (H(f)>0 dB) between the lower and upper boundaries of the bandpass filter; that is, between frequencies 510 and 512, respectively. This restriction ensures a single-pole roll-off at unity gain (0 dB) on both ends of the passband region. The range of frequencies to be clamped is represented as all frequencies, f, for which loop gain H(f)>1.

Figure 6:
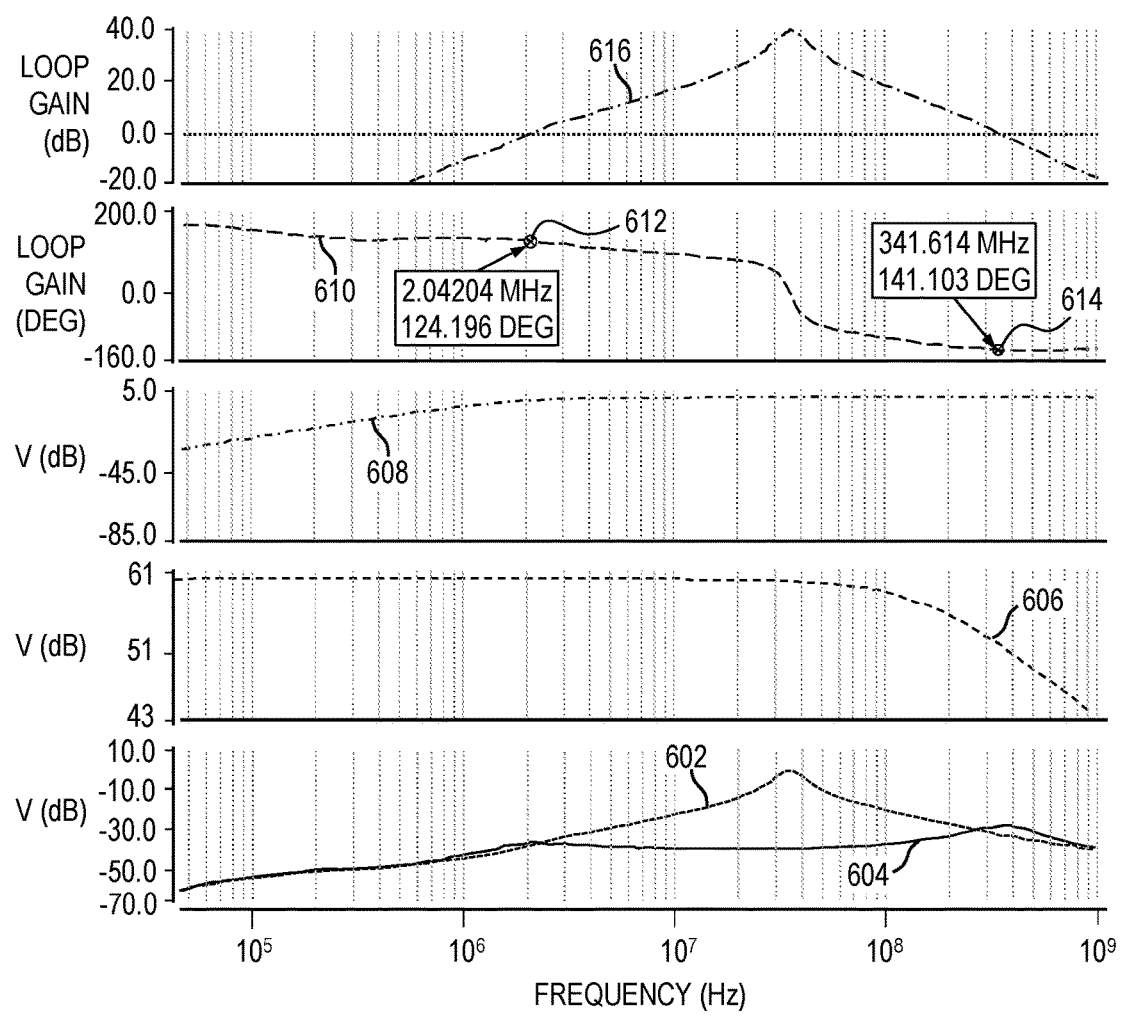
FIG. 6 are waveforms showing exemplary simulation results for several nodes in the illustrative integrated voltage regulator circuit shown in FIGS. 3 and 4, according to an embodiment of the invention.

With reference to FIG. 6, exemplary simulation results are depicted for several nodes in the illustrative integrated voltage correction circuit 400 shown in FIG. 4, according to an embodiment of the invention. The bottom frame shows a comparison between the original output impedance Zo without clamping, waveform 602, and the clamped output impedance, waveform 604, with the active clamp enabled. Waveform 606 represents the frequency transfer characteristics of the active clamp 308 shown in FIG. 4, depicting a pole at about 300 MHz. Waveform 608 represents the frequency transfer characteristics of the high-pass filter 306 shown in FIG. 4, depicting a pole at about 2 MHz. The top two frames show the loop gain characteristics described in FIG. 5; waveform 610 depicts the loop gain phase in degrees and waveform 616 depicts loop gain amplitude in decibels (dB). Data points 612 and 614 represent the points at which the loop gain is 1 (0 dB), the first point 612 being at a frequency of 2.04204 MHz and a phase of 124.196 degrees, and the second point 614 being at a frequency of 341.614 MHz and a phase of 141.103 degrees. These two points 612, 614 define the lower and upper boundaries, respectively, of the frequency region to be clamped.

Figure 7:
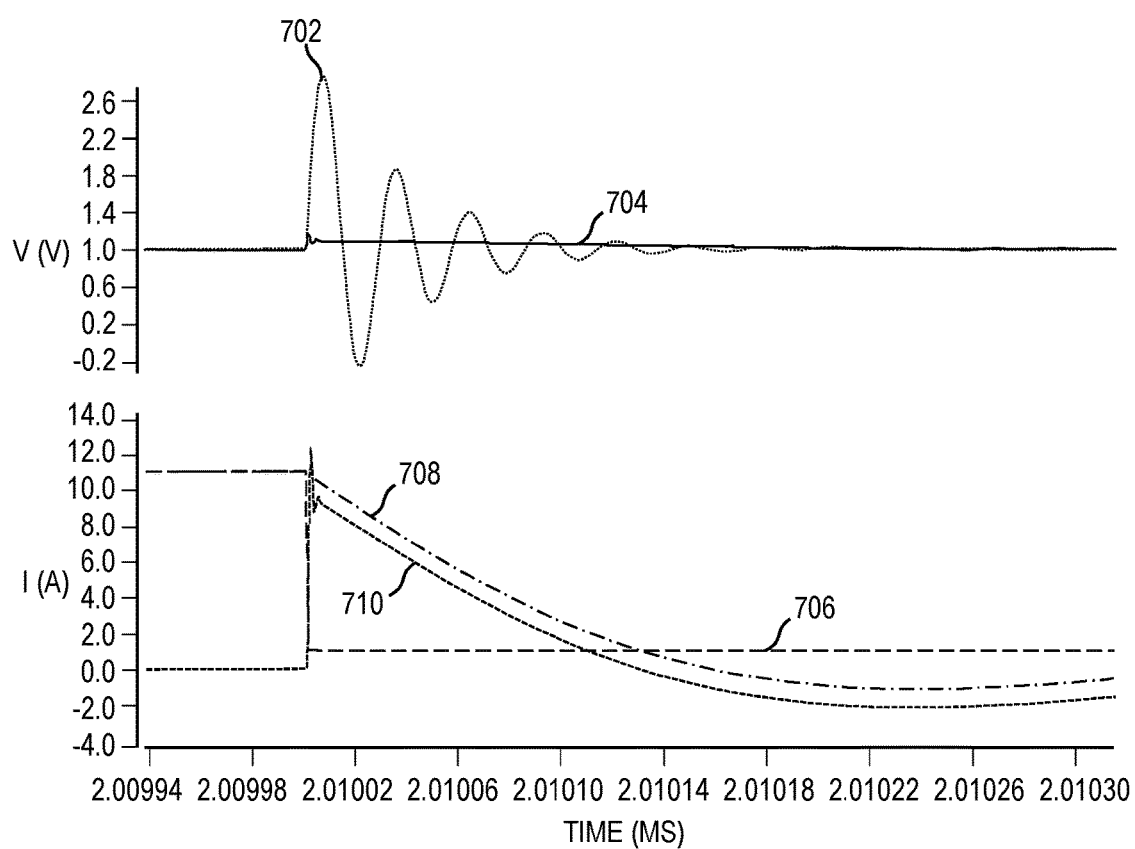
FIG. 7 are waveforms depicting exemplary transient response simulation results for the illustrative integrated voltage regulator circuit shown in FIGS. 3 and 4, according to an embodiment of the invention.

In FIG. 7, voltage and current waveforms depict exemplary transient response simulation results, corresponding to the same circuit used for the simulated frequency response waveforms depicted in FIG. 6, for the illustrative integrated voltage regulator circuit 400 shown in FIG. 4, according to an embodiment of the invention. With reference to FIG. 7, the top frame indicates the regulated output voltage of the integrated voltage regulator circuit 400 without the active clamp enabled (waveform 702) and with the clamp enabled (waveform 704). The bottom frame indicates current waveforms associated with the voltage regulator circuit 400; the load step is depicted in waveform 706, regulator current is depicted in waveform 708, and the clamp current is depicted in waveform 710.

As apparent from FIG. 7, it can be seen that prior to the load step, the clamp current (waveform 710) is 0A, while the load current (waveform 706) is equal to the external regulator current (waveform 708). After the load step, the clamp current, as shown by waveform 710, takes up the excess current from the external regulator, as shown in waveform 708, until the external regulator is able to adjust to the lower load current, as seen in waveform 706. Waveform 702 indicates that if this excess current from the external regulator had not been taken up by the clamp, it would have been driven into the internal capacitance, and created a substantial overshoot at the load, and an LCR oscillation with the parasitic inductance (i.e., ringing in the regulated output voltage). As apparent from the simulation, with the clamped circuit activated, the output voltage overshoot is negligibly small by comparison, as evidenced by waveform 704. There is a slight negative regulator current, as seen in waveform 708, until the output voltage (waveform 704) returns to its intended target.

Given the discussion thus far, it will be appreciated that an exemplary voltage correction circuit, according to an aspect of the invention, includes a high-pass filter coupled with an integrated load at a first node, and an active clamp coupled with the high-pass filter in a closed-loop feedback arrangement. The high-pass filter includes an impedance network having a frequency response defining a lower frequency boundary of a passband of the voltage correction circuit and the active clamp having a frequency response defining an upper frequency boundary of the passband of the voltage correction circuit. The active clamp is adapted to receive an input voltage to be regulated, an output of the active clamp generating a regulated output voltage of the voltage correction circuit. A loop gain of the voltage correction circuit is greater than or equal to one within the passband and is less than one for frequencies lower than the lower frequency boundary and higher than the upper frequency boundary.

Given the discussion thus far, it will also be appreciated that an integrated circuit includes a semiconductor substrate and at least one voltage correction circuit formed on the substrate. The voltage correction circuit includes a high-pass filter operatively coupled with a load (which may or may not be integrated on the same substrate) at a first node, and an active clamp coupled with the high-pass filter in a closed-loop feedback arrangement. The high-pass filter includes an impedance network having a frequency response defining a lower frequency boundary of a passband of the voltage correction circuit and the active clamp having a frequency response defining an upper frequency boundary of the passband of the voltage correction circuit. The active clamp is adapted to receive an input voltage to be regulated, an output of the active clamp generating a regulated output voltage of the voltage correction circuit. A loop gain of the voltage correction circuit is greater than or equal to one within the passband and is less than one for frequencies lower than the lower frequency boundary and higher than the upper frequency boundary.

At least a portion of the techniques of the present invention may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as integrated circuits. One skilled in the art would know how to dice wafers and package dies to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from voltage regulation and/or voltage conversion, in accordance with one or more embodiments of the invention.

An integrated circuit in accordance with aspects of the present disclosure can be employed in essentially any application and/or electronic system where high-frequency voltage regulation and/or correction is desired. This novel architecture can be used to cancel out, or at least significantly reduce, the effects of undesired package parasitic impedances, as was depicted in FIG. 4. However, the concept of active bandpass clamping as depicted in FIG. 3, according to one or more embodiments of the invention, could be advantageously used to boost the transient response of any voltage regulator, thus making it possible to obtain the benefits of a low-frequency regulator and yet still achieve the transient response of a much faster regulator. The high quiescent current of a high-speed transconductance amplifier makes this a more suitable technique for high-power applications, such as, but not limited to, processors, battery chargers, servers, mobile devices, automotive electronics, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "upper," "lower," "front" and "back," where used, are intended to indicate relative positioning of elements or structures to each other when such elements are oriented in a particular manner, as opposed to defining absolute positioning of the elements.

The corresponding structures, materials, acts, and equivalents of all means or step-plus-function elements in the claims below, as may be used, are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments shown and described herein, and that various other changes and modifications are made therein by one skilled in the art without departing from the scope of the appended claims.

What is claimed is:

1. A voltage correction circuit configured to work in conjunction with a voltage source to supply current to a load operatively coupled with the voltage correction circuit, the voltage correction circuit comprising:

a high-pass filter coupled with the load at a first node, the high-pass filter including an impedance network having a frequency response defining a lower frequency boundary of a passband of the voltage correction circuit; and an active clamp coupled with the high-pass filter in a closed-loop feedback arrangement and being adapted to receive, from the voltage source, an input voltage to be regulated, the active clamp having a frequency response defining an upper frequency boundary of the passband of the voltage correction circuit, an output of the active clamp generating a regulated output voltage of the voltage correction circuit;

wherein a loop gain of the voltage correction circuit is greater than or equal to one within the passband and is less than one for frequencies lower than the lower frequency boundary and higher than the upper frequency boundary.

2. The voltage correction circuit of claim 1, wherein the active clamp comprises at least one transconductance amplifier, the transconductance amplifier having a differential input coupled across an output element in the high-pass filter, and having an output coupled with the first node.

3. The voltage correction circuit of claim 2, wherein a transconductance of the at least one transconductance amplifier is configured to be substantially equal to an inverse of an impedance seen by the load at the lower frequency boundary of the passband of the voltage correction circuit.

4. The voltage correction circuit of claim 2, wherein the at least one transconductance amplifier comprises an output stage including at least one transistor, and wherein the active clamp has a pole frequency substantially equal to the upper frequency boundary of the passband of the voltage correction circuit which is controlled as a function of at least one of a circuit architecture of the transconductance amplifier, a bias current level of the transconductance amplifier, a device size of the at least one transistor, and a gate capacitance of the output stage.

5. The voltage correction circuit of claim 1, wherein the impedance network in the high-pass filter comprises at least one resistor connected in series with at least one capacitor, the series connection of the at least one resistor and at least one capacitor being coupled in parallel with the load, such that a load voltage is supplied as an input to the high-pass filter, and a differential voltage across the at least one resistor forms an output of the high-pass filter.

6. The voltage correction circuit of claim 5, wherein the active clamp is configured to vary the current supplied to the load as a function of the differential voltage developed at the output of the high-pass filter.

7. The voltage correction circuit of claim 1, further comprising at least one bypass capacitor connected in parallel between the first node and a voltage return of the voltage correction circuit, wherein the passband of the voltage correction circuit is controlled at least in part as a function of a capacitance of the bypass capacitor.

8. The voltage correction circuit of claim 1, wherein the active clamp comprises:
at least one class D amplifier having a differential input coupled across an output element in the high-pass filter, and having an output serving as a switching node; and
an inductor coupled with the output of the class D amplifier, the inductor serving as an energy storage element for delivering current to the load.

9. The voltage correction circuit of claim 1, wherein the active clamp is configured having a transconductance of about 100 mhos or greater and having a dominant pole at about 300 megahertz or higher.

10. An integrated circuit device, comprising:
at least one voltage correction circuit configured to work in conjunction with a voltage source to supply current to a load operatively coupled with the voltage correction circuit, the voltage correction circuit comprising:
a high-pass filter coupled with the load at a first node, the high-pass filter including an impedance network having a frequency response defining a lower frequency boundary of a passband of the voltage correction circuit; and
an active clamp coupled with the high-pass filter in a closed-loop feedback arrangement and being adapted to receive, from the voltage source, an input voltage to be regulated, the active clamp having a frequency response defining an upper frequency boundary of the passband of the voltage correction circuit, an output of the active clamp generating a regulated output voltage of the voltage correction circuit;
wherein a loop gain of the voltage correction circuit is greater than or equal to one within the passband and is less than one for frequencies lower than the lower frequency boundary and higher than the upper frequency boundary.

11. The integrated circuit device of claim 10, wherein the active clamp in the at least one voltage correction circuit comprises at least one transconductance amplifier, the transconductance amplifier having a differential input coupled across an output element in the high-pass filter, and having an output coupled with the first node.

12. The integrated circuit device of claim 11, wherein a transconductance of the at least one transconductance amplifier is configured to be substantially equal to an inverse of an impedance seen by the load at the lower frequency boundary of the passband of the voltage correction circuit.

13. The integrated circuit device of claim 11, wherein the at least one transconductance amplifier comprises an output stage including at least one transistor, and wherein the active clamp has a pole frequency substantially equal to the upper frequency boundary of the passband of the voltage correction circuit which is controlled as a function of at least one of a circuit architecture of the transconductance amplifier, a bias current level of the transconductance amplifier, a device size of the at least one transistor, and a gate capacitance of the output stage.

14. The integrated circuit device of claim 10, wherein the impedance network in the high-pass filter comprises at least one resistor connected in series with at least one capacitor, the series connection of the at least one resistor and at least one capacitor being coupled in parallel with the load, such that a load voltage is supplied as an input to the high-pass filter, and a differential voltage across the at least one resistor forms an output of the high-pass filter.

15. The integrated circuit device of claim 14, wherein the active clamp is configured to vary the current supplied to the load as a function of the differential voltage developed at the output of the high-pass filter.

16. The integrated circuit device of claim 10, wherein the at least one voltage correction circuit further comprises at least one bypass capacitor connected in parallel between the first node and a voltage return of the voltage correction circuit, wherein the passband of the voltage correction circuit is controlled at least in part as a function of a capacitance of the bypass capacitor.

17. The integrated circuit device of claim 10, wherein the active clamp in the at least one voltage correction circuit comprises:
- at least one class D amplifier having a differential input coupled across an output element in the high-pass filter, and having an output serving as a switching node; and
- an inductor coupled with the output of the class D amplifier, the inductor serving as an energy storage element for delivering current to the load.

18. The integrated circuit device of claim 10, wherein the active clamp in the at least one voltage correction circuit is configured having a transconductance of about 100 mhos or greater and having a dominant pole at about 300 megahertz or higher.

19. The integrated circuit of claim 10, wherein the load and the at least one voltage correction circuit are integrated together on a same substrate.

\* \* \* \* \*